US008373953B2

(12) United States Patent
Stockinger et al.

(10) Patent No.: US 8,373,953 B2
(45) Date of Patent: Feb. 12, 2013

(54) DISTRIBUTION OF ELECTROSTATIC DISCHARGE (ESD) CIRCUITRY WITHIN AN INTEGRATED CIRCUIT

(75) Inventors: Michael A Stockinger, Austin, TX (US); Anthony G Dunne, Carrigaline (IE); Alex P Gerdemann, Austin, TX (US); James W Miller, Austin, TX (US); Daniel J O'Hare, Turners Cross (IE); Paul J Sheridan, Mary Burrough Woods (IE); Jeannie Han Millaway, Panama City Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 1078 days.

(21) Appl. No.: 12/345,507

(22) Filed: Dec. 29, 2008

(65) Prior Publication Data

US 2010/0165522 A1    Jul. 1, 2010

(51) Int. Cl.
    *H02H 9/00* (2006.01)
(52) U.S. Cl. ......................................... 361/56
(58) Field of Classification Search ............ 361/56
    See application file for complete search history.

(56) References Cited

U.S. PATENT DOCUMENTS

| 6,489,688 | B1 | 12/2002 | Baumann et al. | |
|---|---|---|---|---|
| 6,801,416 | B2* | 10/2004 | Hatzilambrou et al. | 361/56 |
| 6,838,775 | B2 | 1/2005 | Takahashi | |
| 7,589,945 | B2* | 9/2009 | Miller et al. | 361/56 |
| 7,593,202 | B2* | 9/2009 | Khazhinsky et al. | 361/56 |
| 2001/0024348 | A1* | 9/2001 | May et al. | 361/56 |
| 2006/0262469 | A1* | 11/2006 | Khazhinsky et al. | 361/56 |
| 2007/0097581 | A1* | 5/2007 | Khazhinsky et al. | 361/111 |
| 2008/0062596 | A1* | 3/2008 | Miller et al. | 361/56 |
| 2010/0157493 | A1* | 6/2010 | Guedon et al. | 361/56 |
| 2010/0246074 | A1* | 9/2010 | Venkatasubramanian et al. | 361/56 |
| 2011/0096446 | A1* | 4/2011 | Croft | 361/56 |
| 2011/0267723 | A1* | 11/2011 | Stockinger et al. | 361/56 |
| 2012/0069478 | A1* | 3/2012 | Caplan et al. | 361/56 |
| 2012/0099228 | A1* | 4/2012 | Lin et al. | 361/56 |

OTHER PUBLICATIONS

Brennan, C.J. et al., "ESD Design Automation for a 90nm ASIC Design System," Electrical Overstress/Electrostatic Discharge Symposium, 2004; Sep. 19-23, 2004; pp. 1-8.
Juliano, P.A. et al., "ESD Protection Design Challenges for a High Pin-Count Alpha Microprocessor in a 0.13 µm CMOS SOI Technology," IEEE Electrical Overstress/Electrostatic Discharge Symposium, 2003; Sep. 21-25, 2003; pp. 1-11.
Miller, J.W. et al., "Comprehensive ESD Protection for Flip-Chip Products in a Dual Gate Oxide 65nm CMOS Technology," Electrical Overstress/Electrostatic Discharge Symposium, 2006; Sep. 10-15, 2006; pp. 186-195.

* cited by examiner

*Primary Examiner* — Ronald W Leja

(57) ABSTRACT

Embodiments of the present disclosure provide an integrated circuit (IC) or semiconductor device. This semiconductor device includes a number of I/O pads or bumps on an outer surface of the semiconductor device, a number of electrostatic discharge (ESD) protection cells and functional modules. Individual ESD protection cells couple to and are downstream of individual I/O pads. Functional modules coupled to and are downstream of individual ESD protection cells. The ESD protection cells protect circuitry within the functional module from electrostatic discharge events. A rail clamp may provide an ESD discharge path between a first power supply bus and a second power supply bus. The ESD protection cells may be collected in groups to form clusters (with linear or irregular placement patterns). These clusters may be distributed autarchically across the semiconductor device overlapping one or more functional modules or within spaces or gaps between the functional modules.

20 Claims, 12 Drawing Sheets

US 8,373,953 B2

DISTRIBUTION OF ELECTROSTATIC DISCHARGE (ESD) CIRCUITRY WITHIN AN INTEGRATED CIRCUIT

TECHNICAL FIELD OF THE INVENTION

The present disclosure relates generally to the integrated circuits (ICs), and more particularly to the distribution of electrostatic discharge (ESD) circuitry within an IC.

BACKGROUND OF THE INVENTION

An integrated circuit (IC) can be damaged when subjected to an over-voltage transient that is higher than the design voltage of functional circuit modules inside the integrated circuit. Electrostatic discharge ("ESD"), originating from such sources as a mechanical chip carrier, a plastic chip storage device, or even a human being can generate a voltage that is many times greater than the design voltage of the integrated circuit. For example, the typical human body can supply an electrostatic discharge of 4 kilovolts or more. For integrated circuits that operate at voltages of less than, for example, 5V (volts), an electrostatic discharge of such proportions can be devastating. In order to protect the functional modules in integrated circuits from ESD events, protection cells are utilized, generally between the functional modules and the input/output ("I/O") terminals (e.g. pads, pins, bumps, etc.) of the integrated circuit. ESD protection circuitry and its layout within semiconductor devices are known from references such as U.S. Pat. Nos. 6,838,775 and 7,446,990.

Integrated circuits (ICs) are also increasing in complexity. The number of devices incorporated within a single IC is greatly increasing and causing the size and complexity of individual ICs to increase. A result of increased component density and improved fabrication technology is the realization of system on chip (SoC) applications. FIG. 1 depicts such an IC or SoC 100 that may include many logic and memory functions within the SoC 100. For example, the IC may include one or more CPU cores, DSP cores, DSP books, memory, control circuitry and analog/mixed signal circuitry modules. These are just a few examples of the types of systems or components that may be integrated into a single IC.

Integrating diverse components within a single IC raises many design challenges. The discrete components may be designed for different entities using different tools or they may follow different design rules. In order for the IC to be useful, the IC must have physical connections to the outside world. Parts of these connections are provided via the IC package. Lower cost wire bond packages are typically used for lower pin count and/or lower performance ICs. Higher cost flip chip packages may, for example be used for higher pin count and/or higher performance ICs.

In FIG. 1, die 102 is configured with an array of flip chip pads or bumps 108. Pads 108 are distributed across die 102, while I/O cells 104 are placed around the edge of die 102 forming what is called the I/O ring. Individual I/O cells 104 are communicatively coupled to individual bumps 108. I/O cells may be of various types, including, for example, signal, clock power or ground. The core region of die 102 contains multiple functional modules 110, which are communicatively coupled to the I/O cells. The I/O cells typically contain ESD protection elements to help prevent damage of the fragile I/O circuitry during an ESD event. In case of digital I/O applications, the digital I/O circuitry is typically contained within the I/O cells together with the ESD protection elements. In case of an analog I/O application, the analog I/O circuitry may be contained inside a functional module in the core region of the die and the primary function of the I/O cells 104 may be housing the ESD protection elements.

Traditional ICs fall into two general categories, core-limited and I/O limited. A core-limited chip is one where the size of the chip is dependent on the amount of logic circuitry (i.e. functional modules 110) contained therein. The perimeter of the chip, in this case, is sufficient to support all the required I/O cells 104, surrounding the core. An I/O-limited IC's size, on the other hand, is dictated by the number of I/O cells 104 on the die's perimeter, wherein cells are as close as possible to each other, consistent with the IC's design rules and packaging rules. Thus I/O limited IC's often contain wasted open space within a die.

Advances in device density within the core have made it possible to reduce the core size of IC devices. However, reduced I/O cell pitch (the pitch is typically defined as the repeat distance between adjacent I/O cells) has been harder to achieve. Therefore, conventional IC designs that are I/O intensive tend to have a die size significantly greater than that of the core.

SUMMARY OF THE INVENTION

Embodiments of the present disclosure are directed to systems and methods that are further described in the following description and claims. Advantages and features of embodiments of the present disclosure may become apparent from the description, accompanying drawings and claims.

BRIEF DESCRIPTION OF THE DRAWINGS

For a more complete understanding of the present disclosure and the advantages thereof, reference is now made to the following description taken in conjunction with the accompanying drawings in which like reference numerals indicate like features and wherein.

DETAILED DESCRIPTION OF THE INVENTION

Figure 1:
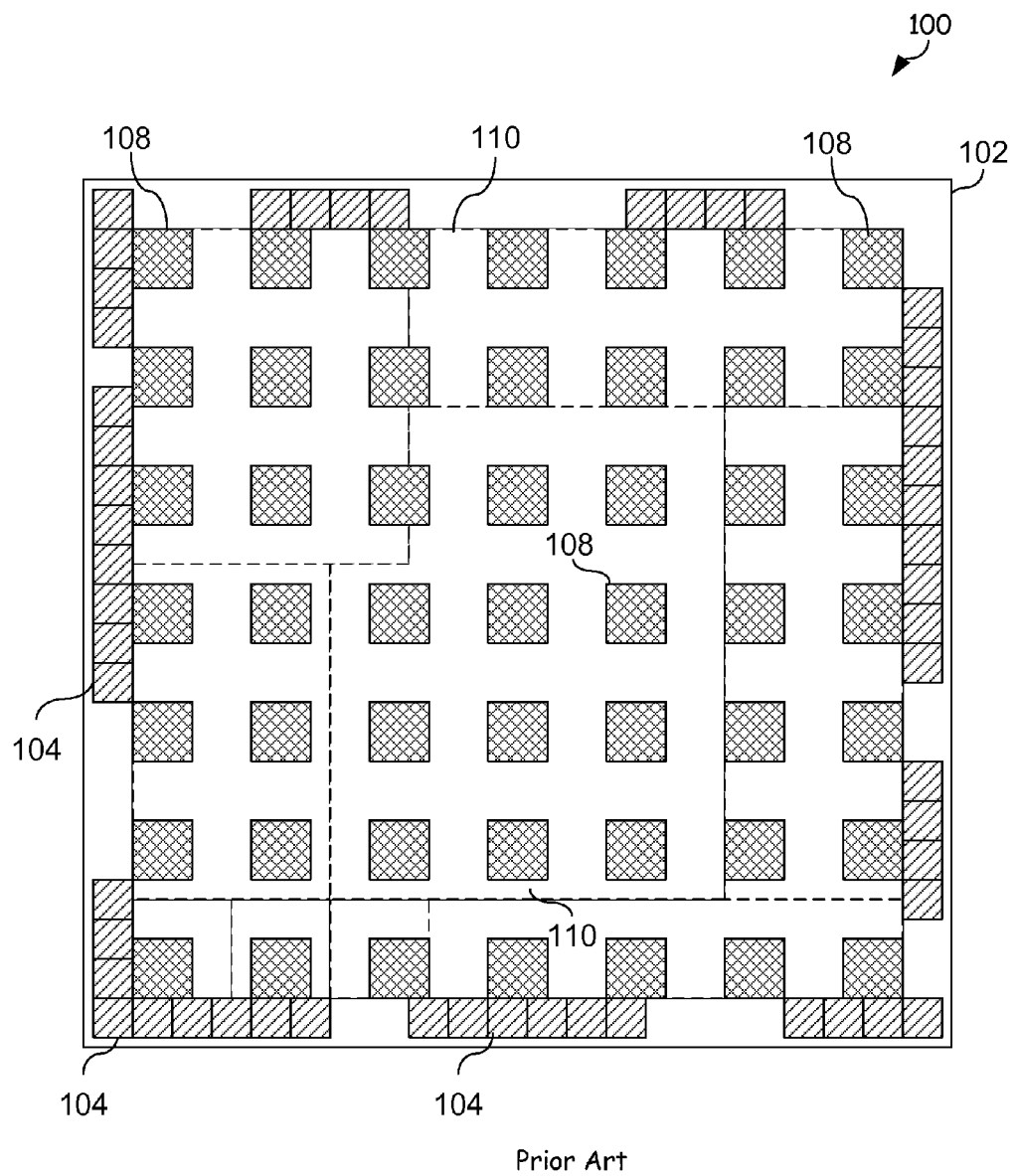
FIG. 1 provides a block diagram describing the architecture of a prior art system on a chip (SoC) integrated circuit (IC)

Preferred embodiments of the present disclosure are illustrated in the FIGs., like numerals being used to refer to like and corresponding parts of the various drawings.

Embodiments of the present disclosure provide an integrated circuit (IC) or chip architecture and a method of providing electrostatic discharge (ESD) protection to input/output (I/O) circuits and associated functional modules within an IC that substantially addresses the previously identified problems, as well as others. Particularly, embodiments of the present disclosure may provide a different approach to the placement of ESD protection cells within an IC that may improve performance and decrease die size.

Embodiments of the present disclosure provide an IC or semiconductor device. This semiconductor device includes a number of I/O pads or bumps on an outer major surface of the semiconductor device, a number of electrostatic discharge (ESD) protection cells, and functional modules. Individual ESD protection cells couple to and are downstream of individual I/O pads. Functional modules couple to and are downstream of individual ESD protection cells. In this context, the term "downstream" refers to a relative physical location along a signal path (or "stream") starting at the I/O pad and ending inside the functional module. The ESD protection cells protect circuitry within the functional module(s) from damage due to ESD events. A rail clamp may provide an ESD discharge path between a first power supply bus and a second power supply bus. The ESD protection cells may be coupled to the first and second power supply buses. The ESD protection cells may also be collected in groups to form clusters (with linear or irregular placement patterns) and these clusters may be distributed autarchically (i.e. without a fixed relative location with respect to the I/O bumps, functional modules, or the periphery of the die) across the semiconductor device. The clusters may overlap one or more functional modules or may be placed in gaps or spaces between functional modules.

The semiconductor device may include analog circuits located proximate to the ESD protection cells that are protecting these analog circuits. This location of the ESD protection cells may reduce signal routing length between I/O pads and functional modules, thus reducing potential signal degradation caused to an analog signal. The ESD protection cells may be abutted to form ESD cell segments such as linear ESD clusters or the ESD cells may be arranged in an irregular pattern within the cluster.

Another embodiment of the present invention provides a layout method associated with the design of a semiconductor device. This may involve the steps of arranging the location of I/O pads, arranging the location of functional modules (to include analog functional modules or circuitry), and then arranging the location of ESD protection cells to form ESD clusters within an interior region of the semiconductor device or die. A first power supply bus and a second power supply bus couple to the ESD protection cells within ESD clusters. A rail clamp may provide a discharge path between the first and second power supply buses. ESD clusters may be arranged autarchically on the semiconductor device and proximate to functional modules in order to reduce signal routing length, reduce silicon area, and/or improve performance.

Yet another embodiment provides a method to provide ESD protection within a semiconductor device. This involves coupling ESD protection cells to I/O pads or bumps arranged in circuits of a semiconductor device. The ESD protection cells couple to functional modules and provide protection of the functional modules or to circuitry within the functional modules. These ESD protection cells may be grouped into clusters (with a linear or irregular placement pattern) and coupled to a first power supply bus and second power supply bus. A rail clamp may provide a discharge path between the first and second power supply buses.

Figure 2:
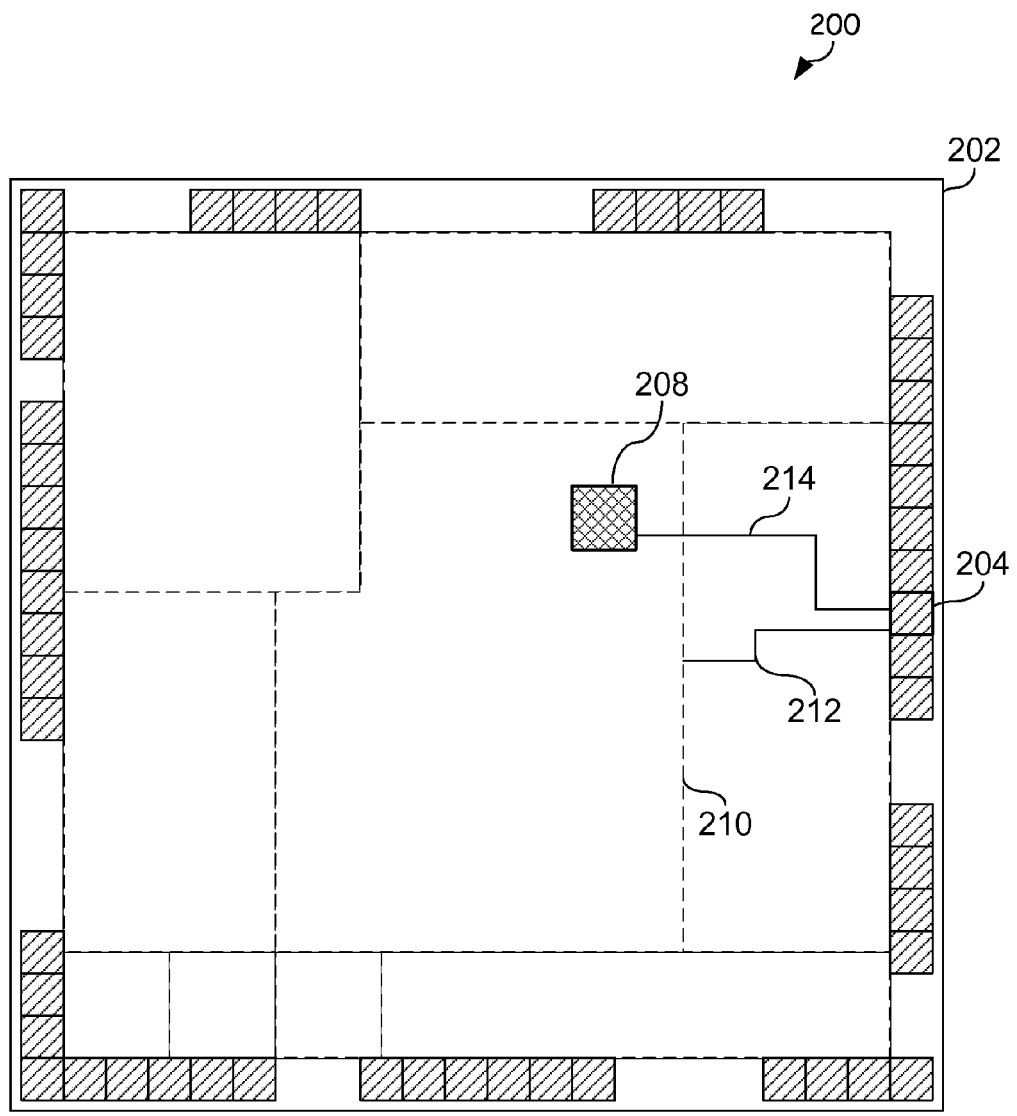
FIG. 2 provides a block diagram describing the electrostatic discharge (ESD) protection cells typically contained within the perimeter of the SoC of FIG. 1.

In conventional I/O and ESD distribution schemes, such as that employed by IC or SoC 100 of FIG. 1, the I/O cells 104 are placed along the perimeter of the major surface of the semiconductor device or die. FIG. 2 provides a prior art embodiment wherein a flip chip 202 as part of an IC 200 utilizes a bond pad or bump 208 which is coupled to an I/O cell 204 through a conductive trace 214. In turn, the I/O cell 204 is coupled to a functional module 210 with a conductive trace 212. If functional module 210 uses an analog I/O circuit and analog signals are provided on the conductive traces 212 and 214, I/O cell 204 contains mostly ESD protection circuitry, the analog I/O circuit is contained within the functional module itself, and the analog I/O cell 204 can also be referred to as an ESD cell. In such a case, these analog signals may be susceptible to noise coupled into conductive traces 212 and 214, for example, from underlying circuits. Embodiments of the present disclosure may reduce the length of the conductive traces and thereby improve the frequency performance and reduce the noise coupled into these traces by moving the I/O cell 204 that contains the ESD protection circuitry from the periphery of die 202 closer to functional module 210 and bond pad 208.

The present disclosure also helps to reduce metal routing congestion. Conventional I/O and ESD cells are located at or near the chip periphery forming an I/O ring, with sometimes significant distance from the I/O bumps and the functional modules. The conductive traces needed for signal routing between the I/O pads, the ESD protection cells, and the functional modules are typically long and may consume a significant portion of the available routing space on the chip. With the present disclosure, the required length of the conductive traces can be reduced to a minimum, thereby freeing up routing space for other purposes, for example, for improving the power and ground supply grid.

Figure 3A:
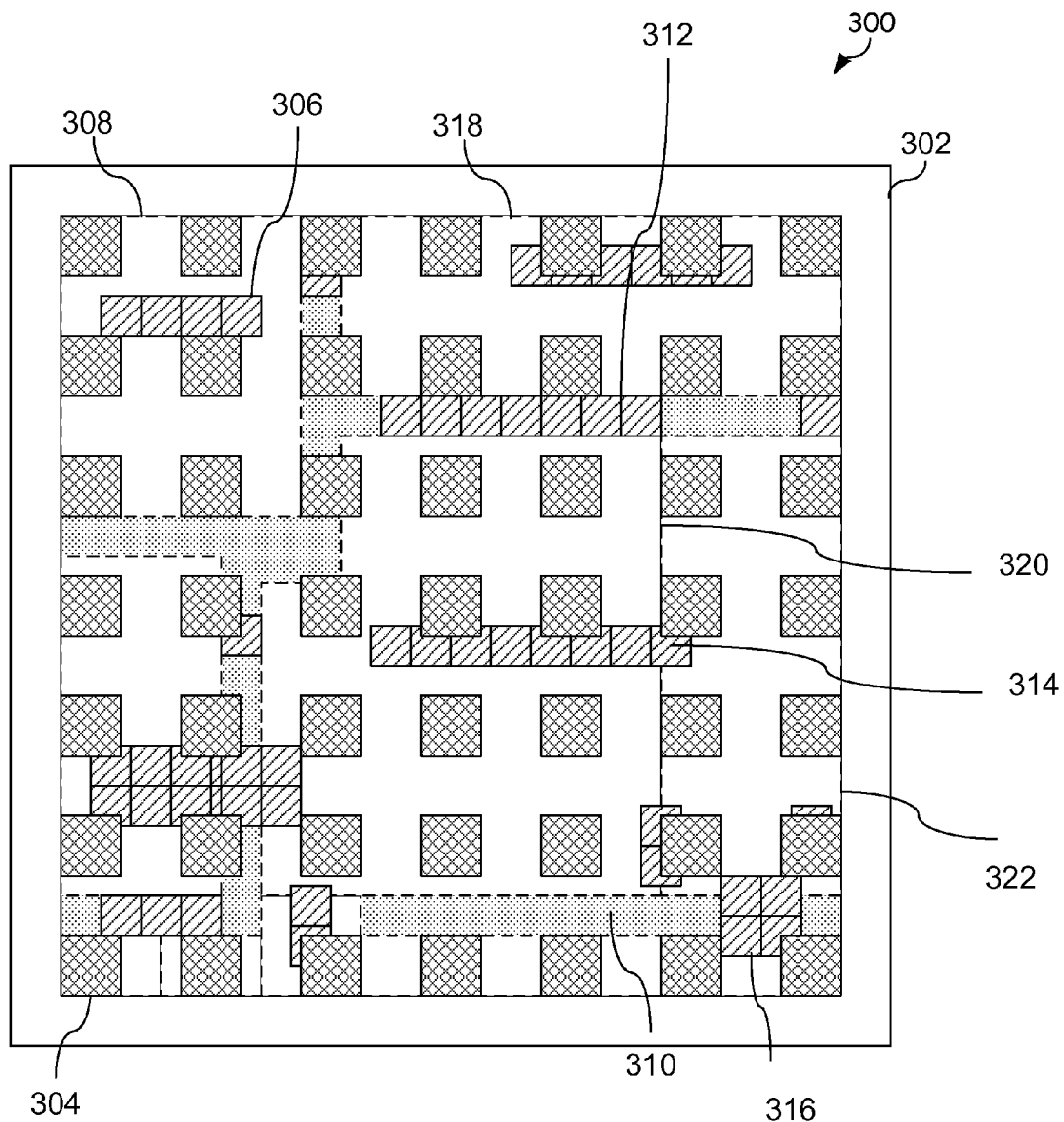
FIGS. 3A and 3B provide block diagrams describing architectures of an SoC IC in accordance with embodiments of the present disclosure.

FIG. 3A depicts an IC 300 manufactured in accordance with embodiments of the present disclosure. IC 300 includes a die 302 with a number of bond pads 304 distributed across the surface of die 302 as may be encountered in a flip chip design. IC 300 also includes a number of ESD protection cell clusters 306, 312, 314, and 316 which may be incorporated within functional modules 308, 318, 320, or 322 or within gaps 310 located between functional modules. FIG. 3A shows that ESD protection cell cluster 306 may be located within functional module 308. Alternatively, ESD protection cell cluster 312 may be located within gaps between functional modules 318 and 320. In other embodiments such as those shown with respect to ESD protection cell cluster 314, the ESD protection cell may straddle one or more functional modules 320 and 322. Additionally, as shown with respect to the group of ESD protection cell cluster 316, a number of protection cells may be utilized to serve one or more functional modules. It is important to note that the ESD protection cell clusters as shown are located throughout the interior regions of the IC 300 rather than being limited to the periphery of the die.

Figure 3B:
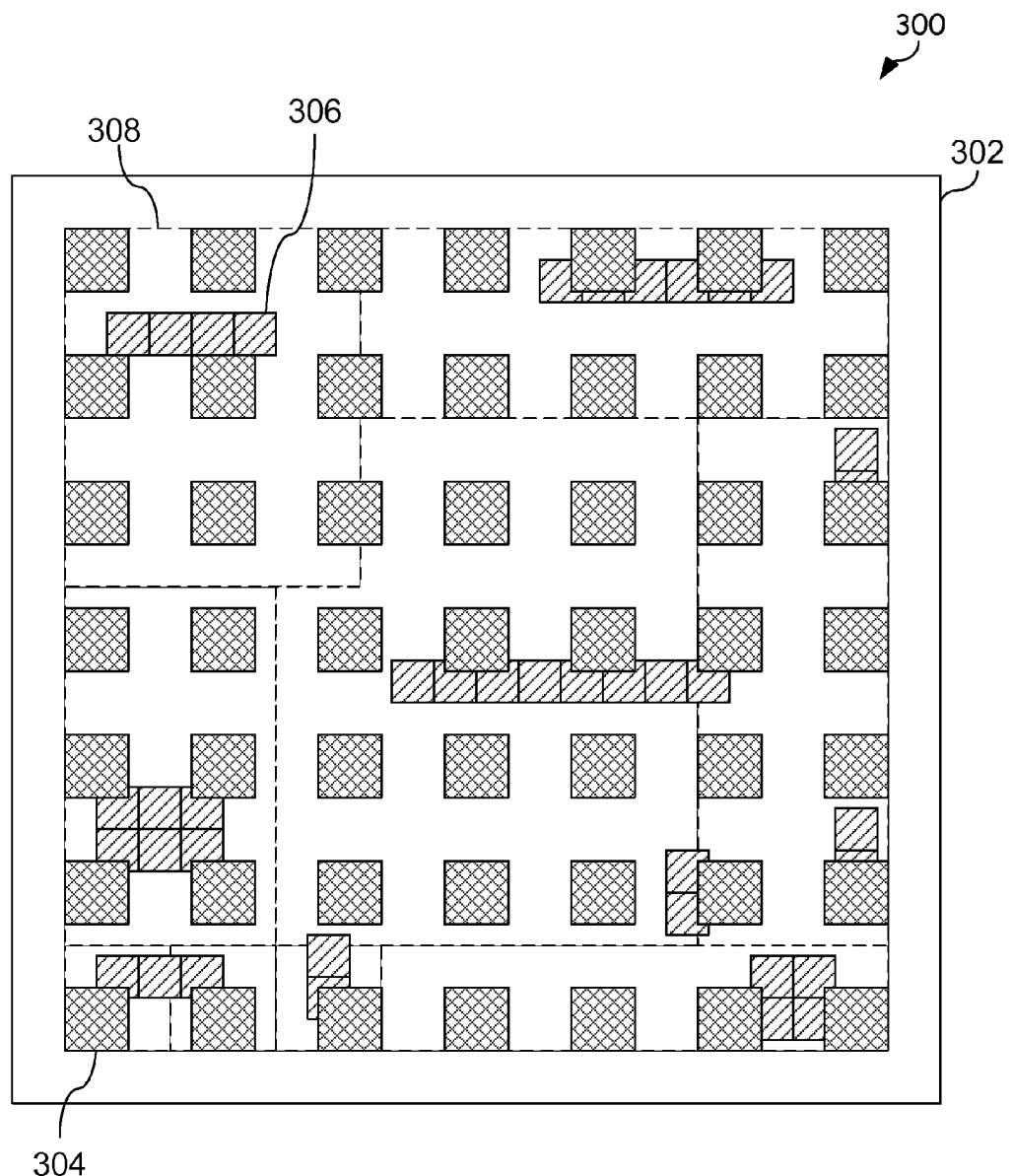

FIG. 3B depicts an IC 300 in accordance with embodiments of the present disclosure with a number of bond pads 304 distributed across the surface of die 302 wherein in this embodiment a die 302 has ESD protection cell clusters 306 incorporated within functional modules 308 or straddling the boundaries between functional modules. These ESD protection cell clusters 306 are located throughout the interior regions of the IC 300. As shown here, die size is minimized by eliminating the gaps 310 of FIG. 3A in between functional modules 308. As shown in FIG. 3B, the ESD cell clusters can have various different shapes. In one embodiment, a cluster may comprise a linear segment of ESD cells. In another embodiment, a cluster may be formed by a more irregular placement of ESD cells that are in close proximity of one another. ESD clusters of different shapes may be used on the same die.

Figure 4A:
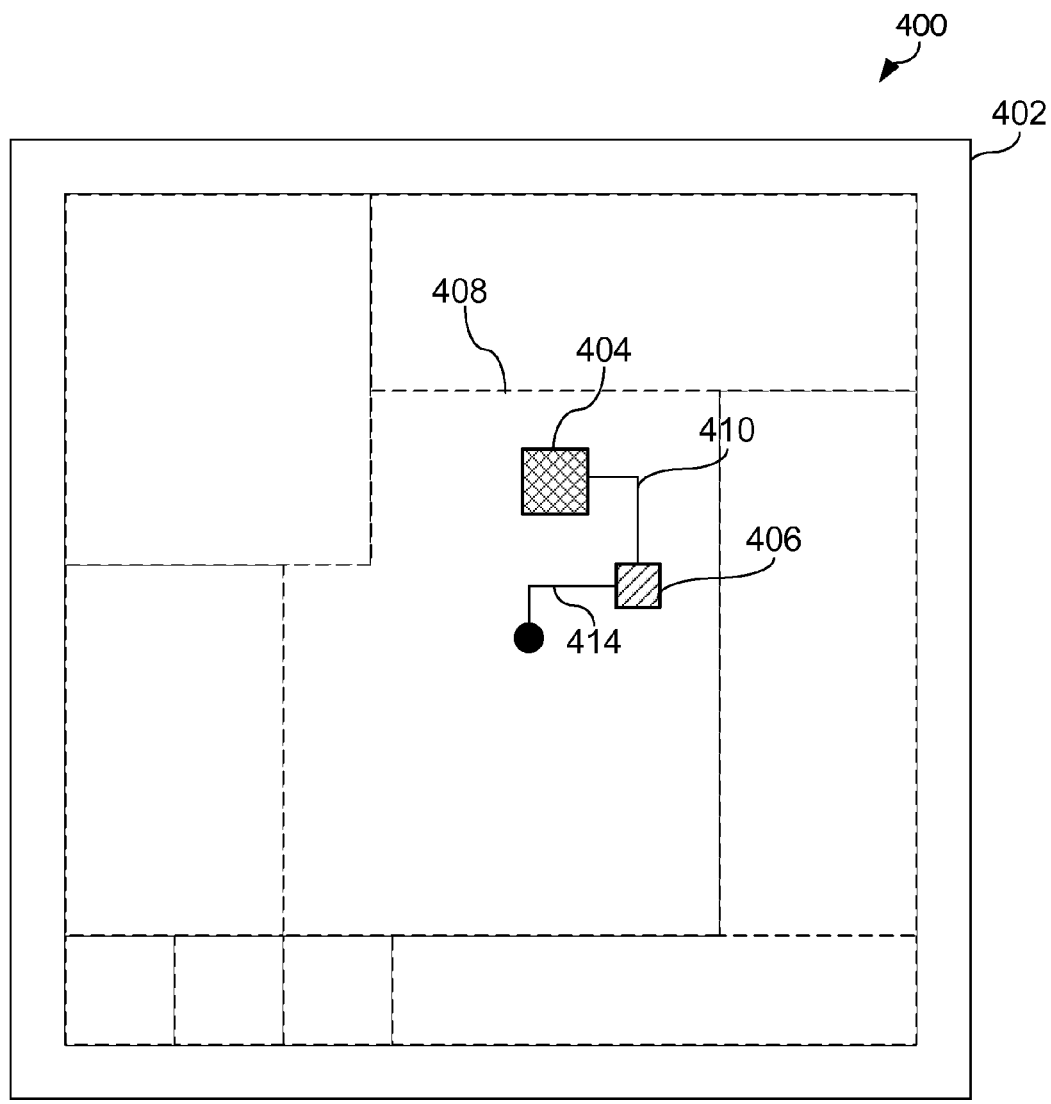
FIGS. 4A and 4B provide block diagrams describing the ESD architecture of an SoC IC in accordance with embodiments of the present disclosure.
Figure 4B:
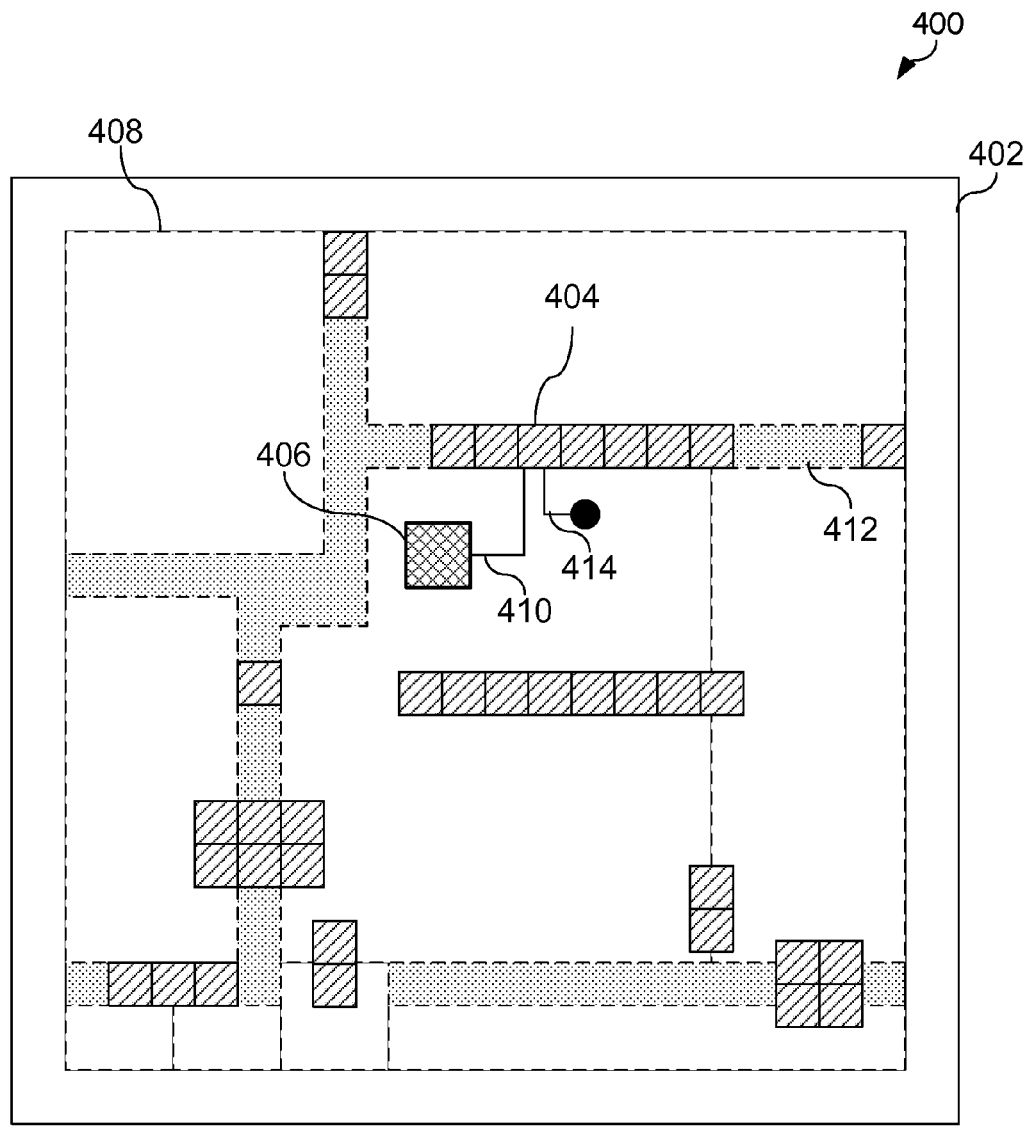

FIG. 4A and FIG. 4B depict in further detail examples of the placement of an ESD protection cell 406 located throughout the interior regions of the IC that overlap functional module 408 (FIG. 4A) or cross boundaries or fill gaps or spaces 412 (FIG. 4B). These locations allow the length of signal lines or traces to be reduced as compared to the signal traces shown in prior art FIG. 2. As shown in FIG. 4A and FIG. 4B, integrated circuit 400 includes a number of functional modules 408 on a die 402. As shown here to illustrate the reduced traces, bond pad 404 is coupled to ESD protection cell 406 via conductive trace 410. Then ESD protection cell 406 may be coupled to the functional module 408 via conductive trace 414. These conductive traces are significantly reduced in scope when compared to the conductive traces illustrated in FIG. 2 where the ESD protection cells were placed along the perimeter of the die. This may be of particular importance to analog circuits where an analog signal may be particularly sensitive to coupling of noise that may be introduced with a longer conductive trace.

Figure 5:
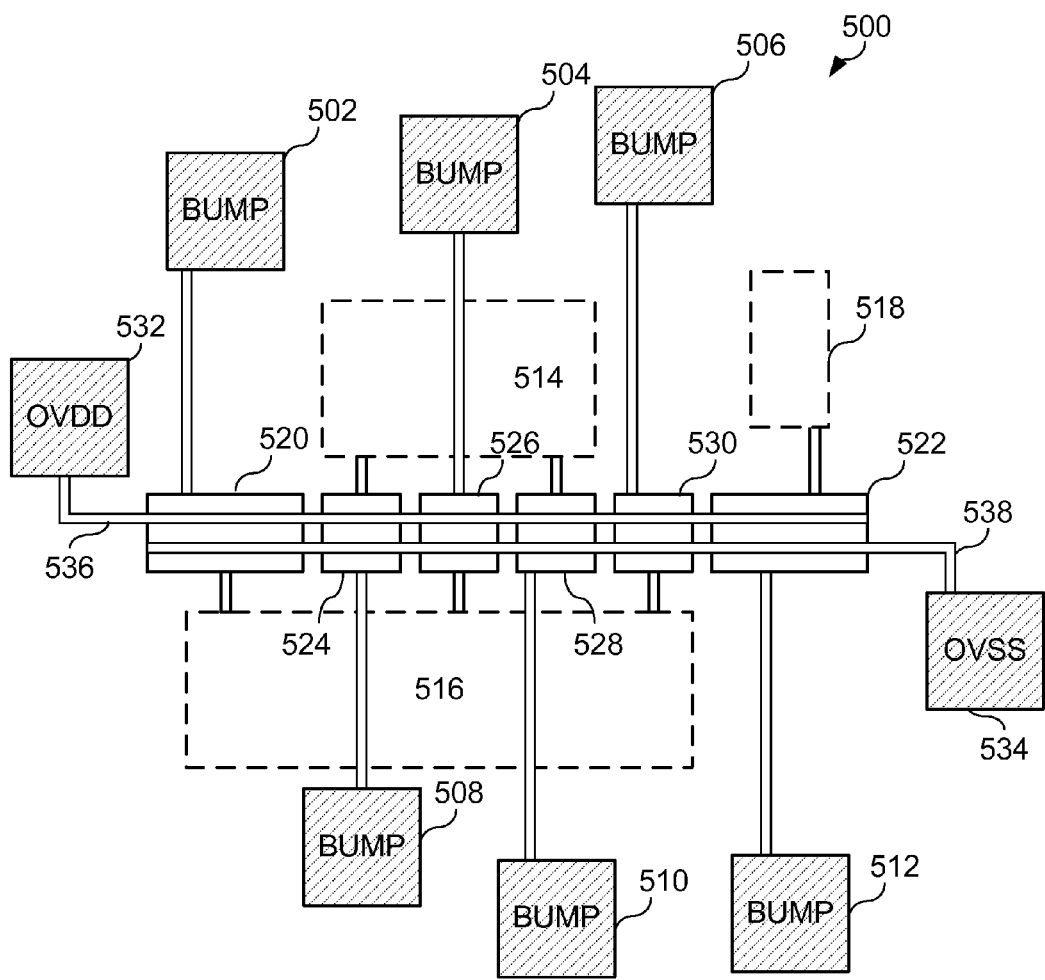
FIG. 5 provides a functional block diagram in accordance with embodiments of the present disclosure.

FIG. 5 provides a functional block diagram of an I/O and ESD protection scheme 500 in accordance with embodiments of the present disclosure. Shown here are input/output (I/O) bumps 502, 504, 506, 508, 510 and 512. These I/O pads or bumps may provide I/O connectivity to the functional modules 514, 516 and 518. ESD protection may be provided by ESD protection cells 520, 522 as well as 524, 526, 528, and 530. In the specific embodiment of FIG. 5, the ESD cells are arranged within a linear cluster. The individual ESD protection cells may differ from one another. In the embodiment of FIG. 5, the ESD cells 520 and 522 at the left and right ends of the linear cluster are larger than the ESD cells 524, 526, 528, and 530 in the middle of the cluster. The OVDD pad 532 and the OVSS pad 534 supply power to the functional modules via power supply buses 536 (for OVDD) and 538 (for OVSS). The ESD protection cells may couple to these power supply buses. In one embodiment, these power supply buses straddle the ESD cells to provide a robust and low-resistive connection to the ESD cells. One or more ESD rail clamp devices may be coupled between the OVDD and OVSS power supply buses to provide an ESD discharge path between the power supply buses during an ESD event.

In one embodiment of this disclosure, individual rail clamp devices may be part of a larger, distributed rail clamp network and connected in parallel to provide multiple ESD current paths between the OVDD and OVSS supply buses. In one embodiment, ESD rail clamp devices may be included in one or more ESD protection cells. Two different ESD protection cells, one with a small rail clamp and the other one with a large rail clamp may be used, the cell with the large rail clamp (e.g. ESD protection cells 520 and 522) effectively terminating the distributed rail clamp network of the linear cluster shown in FIG. 5. The cells with the small rail clamp (e.g. ESD protection cells 524, 526, 528, and 530) may be used as inner cells of the linear cluster to provide an approximately uniform ESD protection level for the I/O pads, i.e. minimize the variation of the ESD protection level over the I/O pads. In yet another embodiment, a single rail clamp device may be used in the cluster, which may be contained in one of the ESD protection cells or which may be placed as a separate cell (not shown) in close proximity to the cluster.

I/O circuits of multiple functional modules 514, 516 and 518 may be protected by ESD protection cells of the same cluster. In one embodiment, these functional modules are supplied by the same OVDD and OVSS power supply buses.

Figure 6:
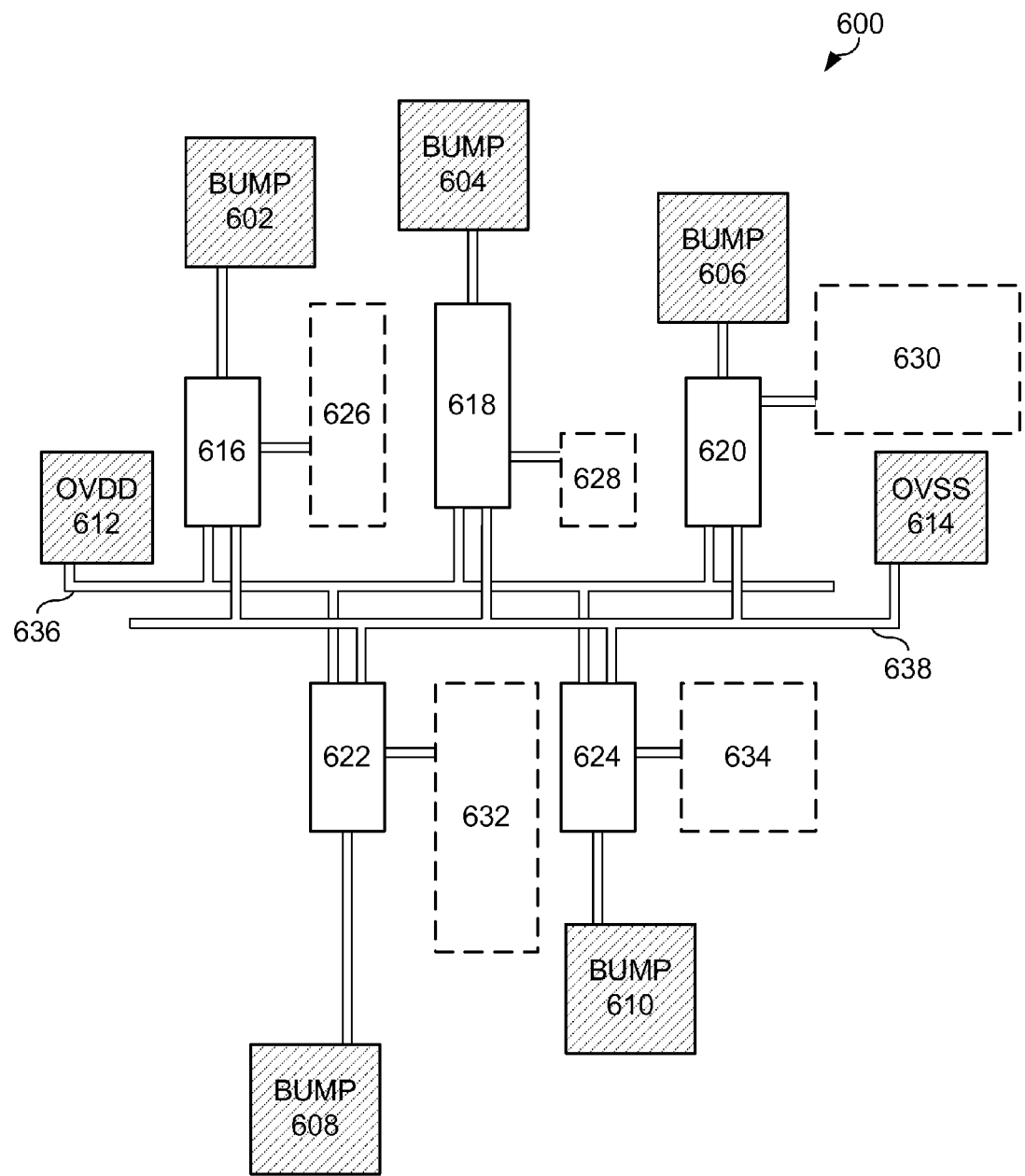
FIG. 6 provides a second functional block diagram in accordance with embodiments of the present disclosure.

FIG. 6 provides a second functional block diagram of an I/O and ESD protection scheme 600 in accordance with embodiments of the present disclosure. The I/O and ESD protection scheme 600 includes I/O bumps 602, 604, 606, 608 and 610, OVDD bump 612 and OVSS bump 614, and ESD protection cells 616, 618, 620, 622, and 624 that are tied to individual functional modules 626, 628, 630, 632 and 634, respectively. In FIG. 6, the OVDD pad 612 and the OVSS pad 614 are connected to the ESD protection cells via power supply buses 636 and 638, respectively. In FIG. 6, the ESD protection cells are placed in an irregular placement pattern, not in a linear segment like in FIG. 5. In one embodiment of this disclosure, this irregular placement pattern of ESD protection cells may provide a more flexible placement option with a higher layout area efficiency than the linear placement pattern of FIG. 5 because the ESD protection cells may be conveniently placed in small gaps between functional modules or between circuit blocks within a functional module, thereby sharing the same layout area with the functional module. This irregular placement pattern may also help to further reduce the overall signal path length from the I/O pads to the functional modules because the ESD protection cells, which are in the signal path, may be placed even closer to the I/O bumps and functional modules.

The ESD protection cells of FIG. 6 may be placed in larger distance from each other than the ones of FIG. 5 where the ESD protection cells may be abutted to each other with minimum spacing between adjacent cells. In one embodiment of FIG. 6, rail clamps that are contained inside ESD protection cells may also need to be larger than some rail clamps used for the embodiment of FIG. 5 to compensate for the increased power supply bus resistance between the ESD protection cells of FIG. 6. In one embodiment placing the ESD protection cells of a cluster as closely together as possible in order to maximize the ESD protection performance may be desirable. This may be achieved by demanding for a specific maximum OVDD and OVSS bus resistance value to be maintained between any adjacent ESD protection cells in the cluster.

Figure 7:
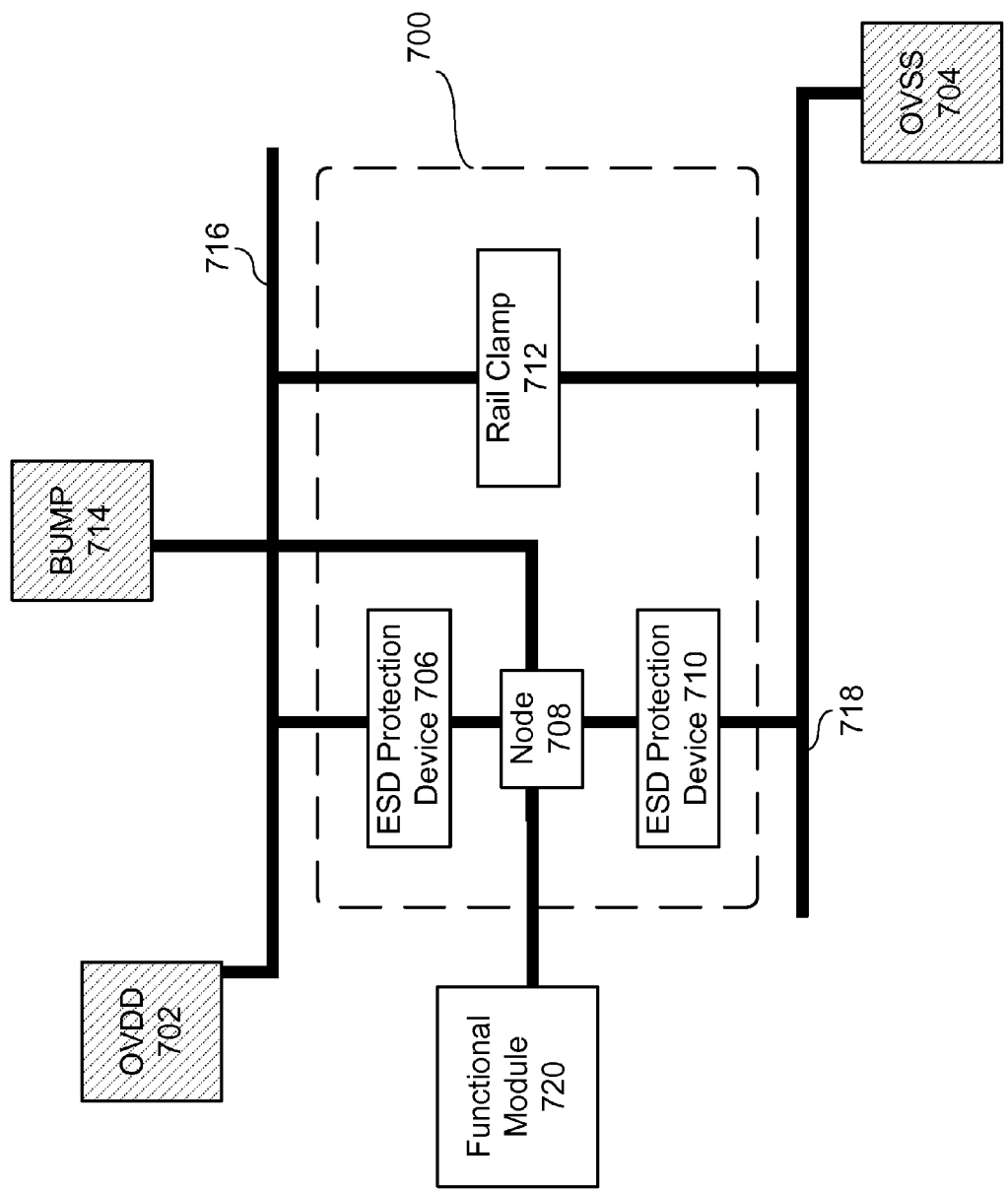
FIG. 7 depicts a functional block diagram of an ESD protection cell in accordance with embodiments of the present disclosure.

FIG. 7 depicts the elements of an ESD protection cell in accordance with embodiments of the present disclosure. ESD protection cell 700 may be placed between a first power supply bus 716, which is connected to an OVDD pad 702, and a second power supply bus 718, which is connected to an OVSS pad 704. An I/O pad or bump 714 is connected to a circuit node 708. A functional module 720 is also connected to circuit node 708. In the embodiment shown in FIG. 7, the ESD protection cell 700 includes an ESD protection device 706 operable to shunt current between node 708 and the OVDD bus 716 during an ESD event. Device 710, a second ESD protection device, is operable to shunt current between node 708 and the OVSS bus 718 during an ESD event. Devices 706 and 710 may include ESD diodes, MOSFETs, bipolar transistors, or any other devices that are capable of conducting ESD current during an ESD event or any combination thereof. In another embodiment, only one of the two devices 706 and 710 may be present in the ESD protection cell 700 and may be able to provide a bi-directional ESD current path to the power supply bus that device 706 or device 710 couples to. In one embodiment ESD protection may be implemented as described in U.S. Pat. No. 6,724,603 which is hereby incorporated herein by reference in its entirety and made part of the present U.S. Utility Patent Application for all purposes.

In the embodiment of FIG. 7, a rail clamp 712 may be provided to shunt current from OVDD bus 716 to OVSS bus 718 during an ESD event. This rail clamp may be a MOSFET clamp with an RC trigger circuit or a snapback clamp or any other device that is capable of conducting ESD current during an ESD event. Rail clamp 712 may be placed in only one or a plurality of ESD protection cells within an ESD protection cell cluster. In the latter case, multiple clamps may work in parallel during an ESD event to shunt current between the shared OVDD and OVSS buses. Other embodiments may have clusters with multiple different types of ESD protection cells 700. In one embodiment, the size of the rail clamp 712 may vary between ESD protection cells. In another embodiment, the types and/or sizes of ESD protection devices 706 and 710 may vary.

Figure 8:
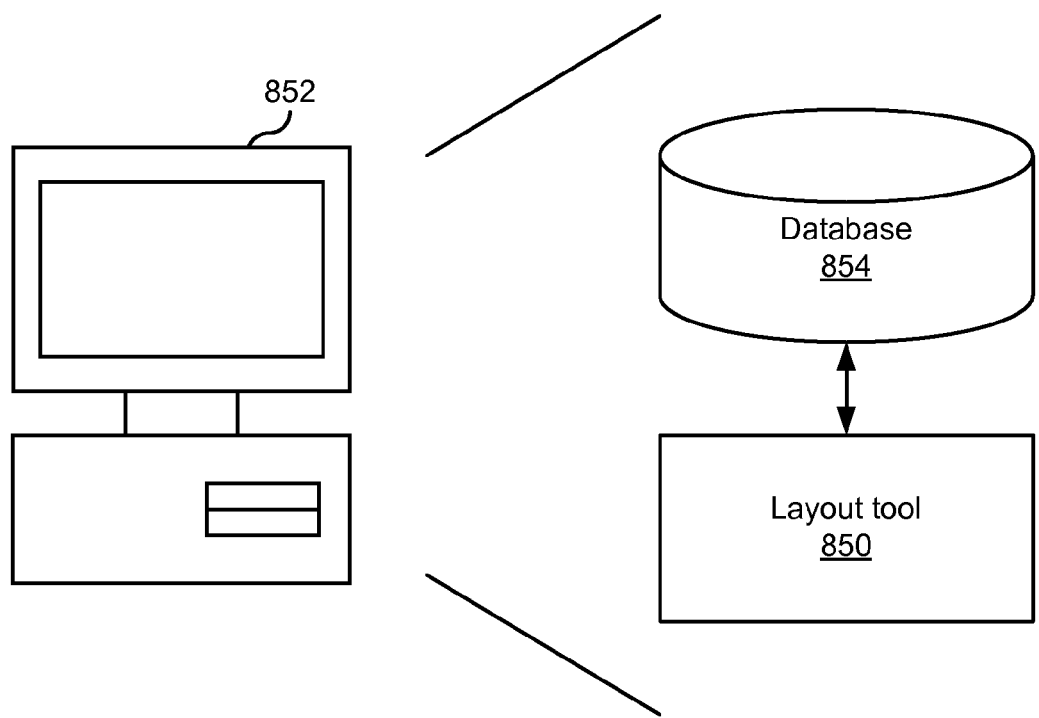
FIG. 8 describes a layout tool operable to be implemented within a computer system in accordance with an embodiment of the present disclosure.

To create the layout of conductive traces such as those discussed above, IC designers often use layout tools to ensure the compliance with and automate the layout of the various IC layers in accordance with the design rules associated with fabrication of a particular IC. FIG. 8 depicts a layout tool 850 that may be implemented with a computer or processing system 852. Processing systems 852 can be any suitable computer-processing device that includes memory for storing and executing logic instructions, and is capable of interfacing with other processing systems. In some embodiments, processing systems 852 can also communicate with other external components via an attached network. Various input/output devices, such as keyboard and mouse (not shown), can be included to allow a user to interact with components internal and external to processing systems. Additionally, processing systems 852 can be embodied in any suitable computing device, and so include personal data assistants (PDAs), telephones with display areas, network appliances, desktops, laptops, X-window terminals, or other such computing devices. Logic instructions executed by processing systems 852 can be stored on a computer readable medium, or accessed by/transmitted to processing systems 852 in the form of electronic signals. Processing systems 852 can be configured to interface with each other, and to connect to external a network via suitable communication links such as any one or combination of Ti, ISDN, or cable line, a wireless connection through a cellular or satellite network, or a local data transport system such as Ethernet or token ring over a local area network. The logic modules, processing systems, and circuitry described herein may be implemented using any suitable combination of hardware, software, and/or firmware, such as Field Programmable Gate Arrays (FPGAs), Application Specific Integrated Circuit (ASICs), or other suitable devices. The logic modules can be independently implemented or included in one of the other system components. Similarly, other components have been discussed as separate and discrete components. These components may, however, be combined to form larger, smaller, or different software modules, integrated circuits, or electrical assemblies, if desired.

Layout tools are software suites or packages that may include layout, verification, places out, schematic capture, and industry standard database conversion and support tools.

Layout tools 850 facilitate the intricate layout design of ICs through the use of attached databases 854. Layout tools in accordance with an embodiment of the present disclosure further facilitate IC design by allowing the die size to be reduced.

Figure 9:
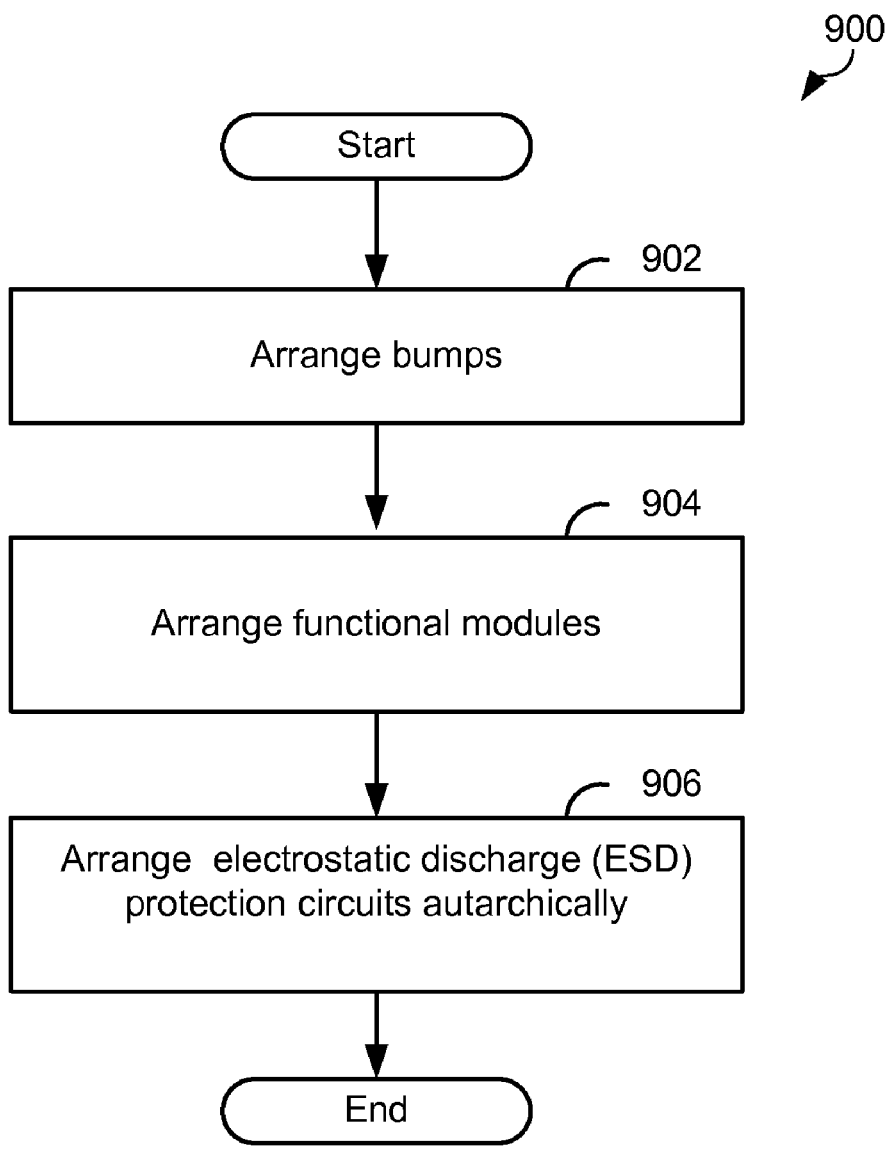
FIG. 9 provides a logic flow diagram illustrating the processes associated with layout associated with the design of an IC in accordance with an embodiment of the present disclosure.

FIG. 9 provides a logic flow diagram in accordance with embodiments of the present disclosure. Operations 900 begin in Step 902 wherein the I/O pads or bumps are arranged on an outer surface of an IC or die. In Step 904 functional modules are arranged. This may result in gaps in between functional modules. Then in Step 906 electrostatic discharge (ESD) protection cells may be arranged within the die. The ESD cells may be located autarchically (i.e. without a fixed relative location with respect to the I/O bumps, the functional modules, or the periphery of the die). For example, ESD cells may be placed within gaps or free space within or in between functional modules in the interior regions of the die.

Figure 10:
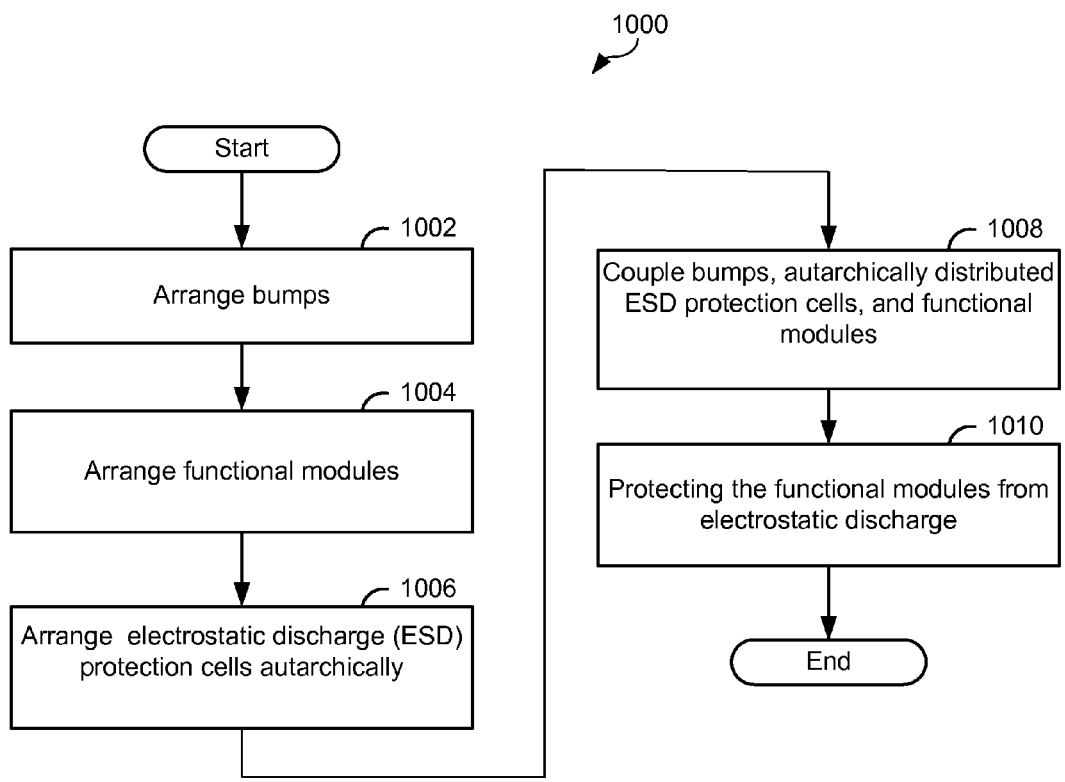
FIG. 10 provides a second logic flow diagram illustrating the processes associated with layout associated with the design of an IC in accordance with an embodiment of the present disclosure.

FIG. 10 provides a logic flow diagram in accordance with embodiments of the present disclosure. Operations 1000 begin in Step 1002 wherein bumps or I/O pads are arranged on the surface of a die. Then in Step 1004 functional modules may be arranged on the die. In Step 1006, ESD protection cells may be arranged on the die. Conductive traces in Step 1008 couple the I/O pads to the ESD protection cells and functional modules. The functional modules may then be protected from ESD events by the ESD protection cells in Step 1010.

In summary, embodiments of the present disclosure provide a semiconductor device. This semiconductor device includes a number of I/O pads or bumps on an outer surface of the semiconductor device, a number of electrostatic discharge (ESD) protection cells and functional modules. Individual ESD protection cells couple to and are downstream of individual I/O pads. Functional modules couple to and are downstream of individual ESD protection cells. The ESD protection cells protect circuitry within the functional modules from failures due to electrostatic discharge. A rail clamp may provide an ESD discharge path between a first power supply bus and a second power supply bus. The ESD protection cells may be collected in groups to form clusters and these clusters may be distributed autarchically with respect to the I/O pads, the functional modules, and the die perimeter across the semiconductor device overlapping one or more functional modules or placed in between functional modules. By placing these ESD protection cells as described, die size may be reduced and the I/O signal integrity may be improved.

As one of average skill in the art will appreciate, the term "substantially" or "approximately", as may be used herein, provides an industry-accepted tolerance to the term's corresponding term. Such an industry-accepted tolerance ranges from less than one percent to twenty percent and corresponds to, but is not limited to, component values, IC process variations, temperature variations, rise and fall times, and/or thermal noise. As one of average skill in the art will further appreciate, the terms "coupled" and "operably coupled", as may be used herein, includes direct coupling and indirect coupling via another component, element, circuit, or module where, for indirect coupling, the intervening component, element, circuit, or module does not modify the information of a signal but may adjust the signal's current level, voltage level, and/or power level. As one of average skill in the art will also appreciate, inferred coupling (i.e., where one element is coupled to another element by inference) includes direct and indirect coupling between two elements in the same manner as "operably coupled".

Although the present disclosure is described in detail, it should be understood that various changes, substitutions and alterations can be made hereto without departing from the spirit and scope of the disclosure as described by the appended claims.

What is claimed is:

1. A semiconductor device comprising:
   a plurality of bumps arranged on a surface of a semiconductor device;

a plurality of electrostatic discharge (ESD) protection cells, wherein individual ESD protection cells couple to and are downstream of individual bumps, the plurality of ESD protection cells are co-located in groups to form at least one ESD cluster located within an interior region of a major side of the semiconductor device, the interior region away from a perimeter of the major side of the semiconductor device, the ESD clusters autarchically located with respect to the bumps, analog functional modules, and the perimeter of the major side of the semiconductor device;

a plurality of analog functional modules wherein the analog functional modules couple to and are downstream of individual ESD protection cells, the ESD protection cells operable to protect circuits within the analog functional modules from ESD; and the ESD protection cells are placed proximate to communicatively coupled bumps and analog functional modules;

a first power supply bus and a second power supply bus; the plurality of ESD protection cells are coupled to the first and second power supply buses; and a rail clamp coupled between the first and second power supply buses, the rail clamp provides an ESD discharge path between the first and second power supply buses.

2. The semiconductor device of claim 1, wherein a plurality of rail clamps is coupled between the first and second power supply buses; the rail clamps work in parallel to provide an ESD discharge path between the first and second power supply buses.

3. The semiconductor device of claim 2, wherein individual ESD cells comprise rail clamps.

4. The semiconductor device of claim 1, wherein at least one of the analog functional modules comprise an analog I/O circuit.

5. The semiconductor device of claim 1, wherein the ESD protection cell location reduces signal routing length to the bumps.

6. The semiconductor device of claim 1, wherein the semiconductor device comprises a flip chip.

7. The semiconductor device of claim 1, wherein ESD protection cells within an ESD cluster are abutted.

8. The semiconductor device of claim 1, wherein ESD protection cell clusters are located between functional modules within the semiconductor device.

9. The semiconductor device of claim 1, wherein ESD protection cells within at least one ESD cluster are abutted to form linear ESD protection cell segments.

10. A semiconductor device comprising:
a plurality of bumps located on a surface of the semiconductor device;
a plurality of electrostatic discharge (ESD) protection cells, wherein individual ESD protection cells couple to and are downstream of individual bumps, the plurality of ESD protection cells are co-located in groups to form at least one ESD cluster located within an interior region of a major side of the semiconductor device, the interior region away from a periphery of a die of the semiconductor device;

a plurality of analog circuitry modules, wherein each of the plurality of analog circuitry modules is coupled to an is downstream of an ESD protection cell of the plurality of ESD protection cells, the ESD protection cells operable to protect the plurality of analog circuit modules from ESD;

a first power supply bus and a second power supply bus, the plurality of ESD protection cells are coupled to the first and second power supply buses; and a rail clamp coupled between the first and second power supply buses, the rail clamp provides an ESD discharge path between the first and second power supply buses.

11. The semiconductor device of claim 10, wherein a plurality of rail clamps is coupled between the first and second power supply buses; the rail clamps work in parallel to provide an ESD discharge path between the first and second power supply buses.

12. The semiconductor device of claim 11, wherein the plurality of rail clamps are implemented in the plurality of ESD cells.

13. The semiconductor device of claim 10, wherein at least one of the analog circuitry comprises an analog I/O circuit.

14. The semiconductor device of claim 10, wherein the semiconductor device comprises a flip chip.

15. The semiconductor device of claim 10, wherein ESD protection cell clusters are located between functional modules within the semiconductor device.

16. The semiconductor device of claim 10, wherein ESD protection cells within at least one ESD cluster are abutted to form linear ESD protection cell segments.

17. The semiconductor device of claim 10, wherein ESD protection cells within an ESD cluster are abutted.

18. A layout method of a semiconductor device, comprising:
arranging a location of a plurality of bumps along a major surface of the semiconductor device;
arranging a location of a plurality of analog functional modules wherein analog functional modules couple to and are downstream of individual electrostatic discharge (ESD) protection cells, the ESD protection cells operable to protect circuits within the functional module from electrostatic discharge; and
arranging a location of groups of individual ESD protection cells to form ESD clusters, the ESD clusters located within an interior region of a major side of the semiconductor device, the interior region away from a periphery of the major side of the semiconductor device, and proximate to communicatively coupled bumps and analog functional modules.

19. The layout method of claim 18 wherein ESD protection cells within an ESD cluster are abutted to form linear ESD protection cell segments.

20. The layout method of claim 18 wherein the plurality of ESD protection cells comprise:
a first set of ESD protection cells; and
a second set of ESD protection cells, the first set of ESD protection cells is larger than the second set of ESD protection cells.

* * * * *